(12) United States Patent
Correale, Jr. et al.

(10) Patent No.: US 6,831,495 B2
(45) Date of Patent: Dec. 14, 2004

(54) METHOD AND CIRCUIT FOR OPTIMIZING POWER CONSUMPTION IN A FLIP-FLOP

(75) Inventors: Anthony Correale, Jr., Raleigh, NC (US); Brian Thomas Kindl, Raleigh, NC (US); Robert James Lynch, Raleigh, NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/065,226

(22) Filed: Sep. 26, 2002

(65) Prior Publication Data

US 2004/0061541 A1 Apr. 1, 2004

(51) Int. Cl.[7] ............................................. H03K 3/289
(52) U.S. Cl. ...................................... 327/202; 327/212
(58) Field of Search ................................ 327/199–203, 327/208, 210–212, 225

(56) References Cited

U.S. PATENT DOCUMENTS

| | | | |
|---|---|---|---|
| 4,686,394 A | 8/1987 | Lam | 307/455 |
| 4,806,786 A | 2/1989 | Valentine | 307/279 |
| 5,250,852 A * | 10/1993 | Ovens et al. | 327/202 |
| 5,378,934 A | 1/1995 | Takahashi et al. | 327/203 |
| 5,926,487 A | 7/1999 | Chappell et al. | 371/22.31 |
| 6,300,809 B1 * | 10/2001 | Gregor et al. | 327/200 |

* cited by examiner

*Primary Examiner*—Kenneth B. Wells
(74) *Attorney, Agent, or Firm*—Scott W. Reid; Sawijer Law Group, LLP

(57) ABSTRACT

A flip-flop is disclosed. The flip-flop includes a first latch for receiving at least one bit and a second latch coupled to the first latch for storing the at least one bit from the first latch. The size of the second latch is minimized to reduce power consumption. The flip-flop also includes a multiplexor coupled to the first latch and to the second latch for outputting the at least one bit from the first latch, when a clock to the multiplexor is active and for outputting the at least one bit from the second latch when the clock is inactive. A system and method in accordance with the present invention optimize power consumption in a flip-flop through the use of a multiplexor for the output function. As a result, the size of the slave latch can be minimized, which reduces the overall power consumption of the device.

9 Claims, 3 Drawing Sheets

US 6,831,495 B2

METHOD AND CIRCUIT FOR OPTIMIZING POWER CONSUMPTION IN A FLIP-FLOP

CROSS REFERENCE TO RELATED APPLICATIONS

The present application is related to application Ser. No. 10/065,228, filed on even date herewith, and entitled "Circuit for preserving Data in a Flip-Flop and a Method of Use."

FIELD OF THE INVENTION

The present invention relates to logic circuits, and more particularly to a method and circuit for optimizing power consumption in a flip-flop.

BACKGROUND OF THE INVENTION

Most VLSI designs have numerous flip-flops integrated within them. Typically, flip-flops are critical to the overall performance of this design. Conventional flip-flops are generally large, power hungry and a significant amount of time is spent optimizing their configuration. It is desirable therefore to minimize the power used by flip-flops in a circuit design. It is known that one way to save power is to shut off sections of the design. For example, one way to save power is to utilize clock gating to disable the clock when it is not used. Also, in an effort to save or minimize standby power, some designs have resorted to disabling non-used sections of the design from the power supply. However, disabling power supply generally results in a loss of stored data in the volatile memory elements.

A solution for the problem of data loss during a standby mode is to transfer the data, or state of a latch, to an on-chip memory before the latch is disconnected from the power supply. Examples of on-chip memory include DRAM, SRAM, or Flash memory. This enables the powering down of the latch to conserve power. This technique, however, requires an auxiliary device, i.e., the on-chip memory.

Accordingly, what is needed is a method and circuit for optimizing power consumption in a flip-flop. The method and circuit should also be cost effective, save space, and easily implemented in existing circuit designs. The present invention addresses such needs.

SUMMARY OF INVENTION

A flip-flop is disclosed. The flip-flop includes a first latch for receiving at least one bit and a second latch coupled to the first latch for storing the at least one bit from the first latch. The size of the second latch is minimized to reduce power consumption. The flip-flop also includes a multiplexor coupled to the first latch and to the second latch for outputting the at least one bit from the first latch when a clock to the multiplexor is active and for outputting the at least one bit from the second latch when the clock is inactive.

A system and method in accordance with the present invention optimize power consumption in a flip-flop through the use of a multiplexor for the output function. As a result, the size of the slave latch can be minimized, which reduces the overall power consumption of the flip-flop and its associated clock tree.

DETAILED DESCRIPTION

The present invention relates to logic circuits, and more particularly to a method and circuit for optimizing power consumption in a flip-flop. The following description is presented to enable one of ordinary skill in the art to make and use the invention and is provided in the context of a patent application and its requirements. Various modifications to the preferred embodiment and the generic principles and features described herein will be readily apparent to those skilled in the art. Thus, the present invention is not intended to be limited to the embodiment shown but is to be accorded the widest scope consistent with the principles and features described herein.

Figure 1:
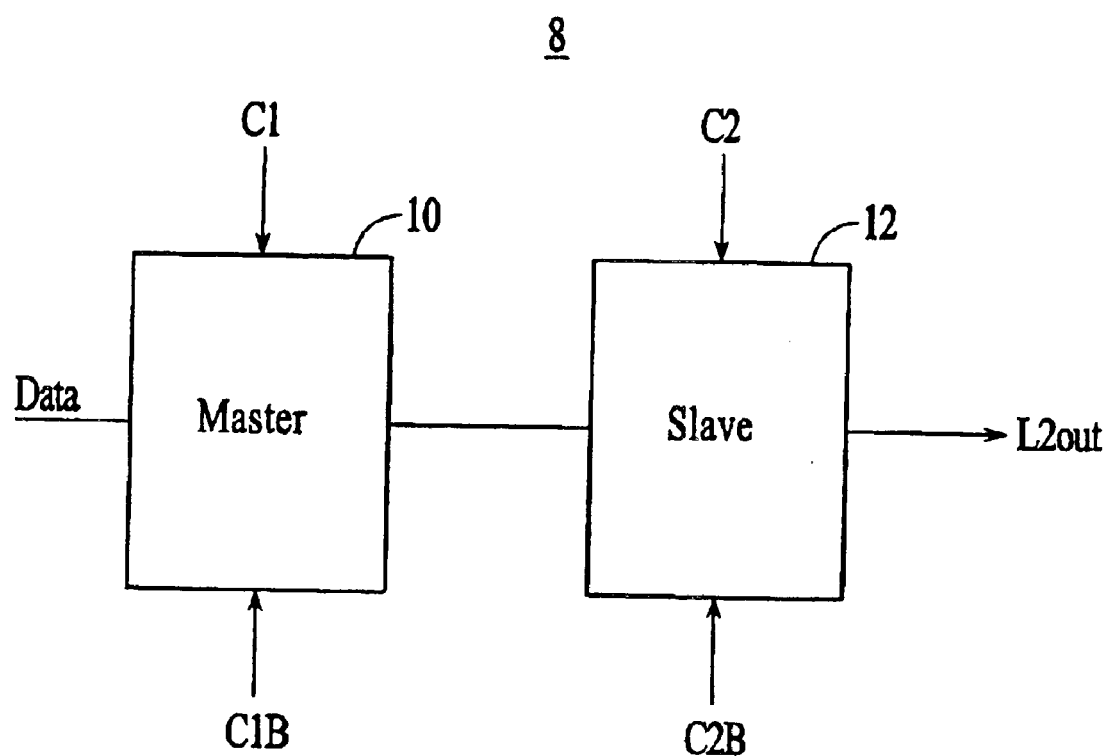
FIG. 1 is a block diagram of a conventional master-slave flip-flop.

FIG. 1 is a block diagram of a conventional master-slave flip-flop (FF) 8. The FF 8 includes a master latch 10 and a slave latch 12. In operation, the master latch 10 receives data (labeled "data"), a clock pulse C1, and a clock set pulse C1B. The slave latch 12 receives a clock pulse C2 and a clock set pulse C2B. The slave latch 12 outputs the data (labeled "L2out"). The clock pulse C1 is driven by a clock C1, and the clock pulse C1B is driven by a clock C1B. Similarly, the clock pulse C2 is driven by a clock C2, and the clock pulse C2B is driven by a clock C2B.

With regard to performance, there are set-up criteria for the master latch and launch criteria for the slave latch. The most performance critical objective of a slave configuration is the slave latch's launch time. The objective is to minimize the time needed to transfer data from the master latch 10 to the slave latch 12. Various latching configurations can be employed, but all generally use a write-thru-read approach. That is, the architecture of the slave latch 12 is such that it stores the incoming data while it is outputting the data. For more performance, the device sizes of the slave latch 12 are generally large enough to support high-speed data transfer. As such, the large device sizes result in increased capacitance and larger area, hence they consume more power.

Figure 2A:
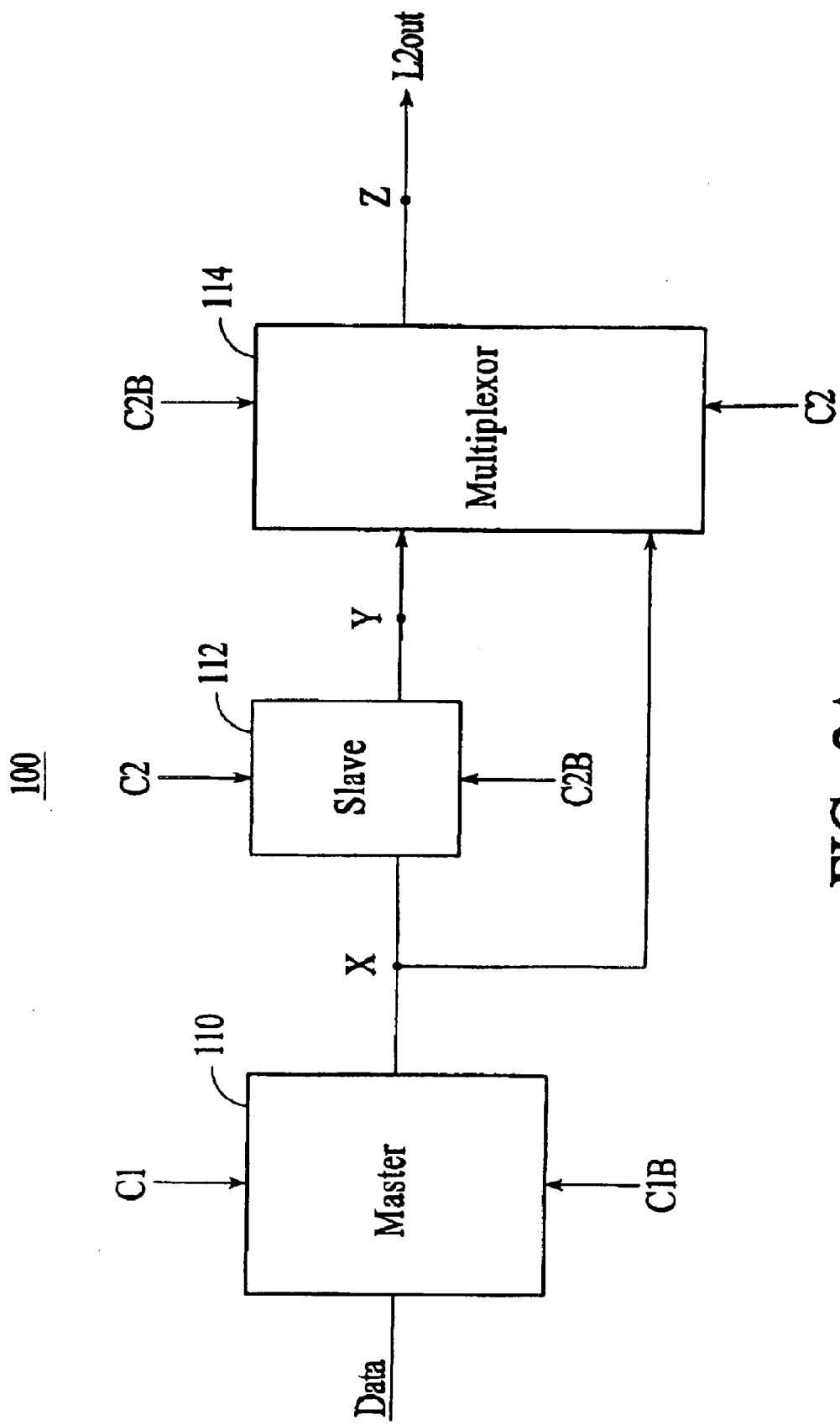
FIG. 2A is a block diagram of a master-slave flip-flop in accordance with the present invention.

FIG. 2A is a high-level block diagram of the FF 100 in accordance with the present invention. The FF 100 includes a master latch 110, a slave latch 112, and a multiplexor 114. As is seen, X, Y and Z nodes are identified. The actual configuration of the master latch 110 and the slave latch 112 can vary and will depend on the specific embodiment. In this embodiment, the multiplexor 114 is a shunt multiplexor.

Because the slave latch 112 does not serve a performance-critical function, it can be implemented utilizing minimum sized devices. By minimizing the size of the devices within the slave latch, the leakage current and the operating current is significantly reduced as compared to the larger conventional slave latch. As a result, the overall power consumption of the FF 100 is optimized.

Figure 2B:
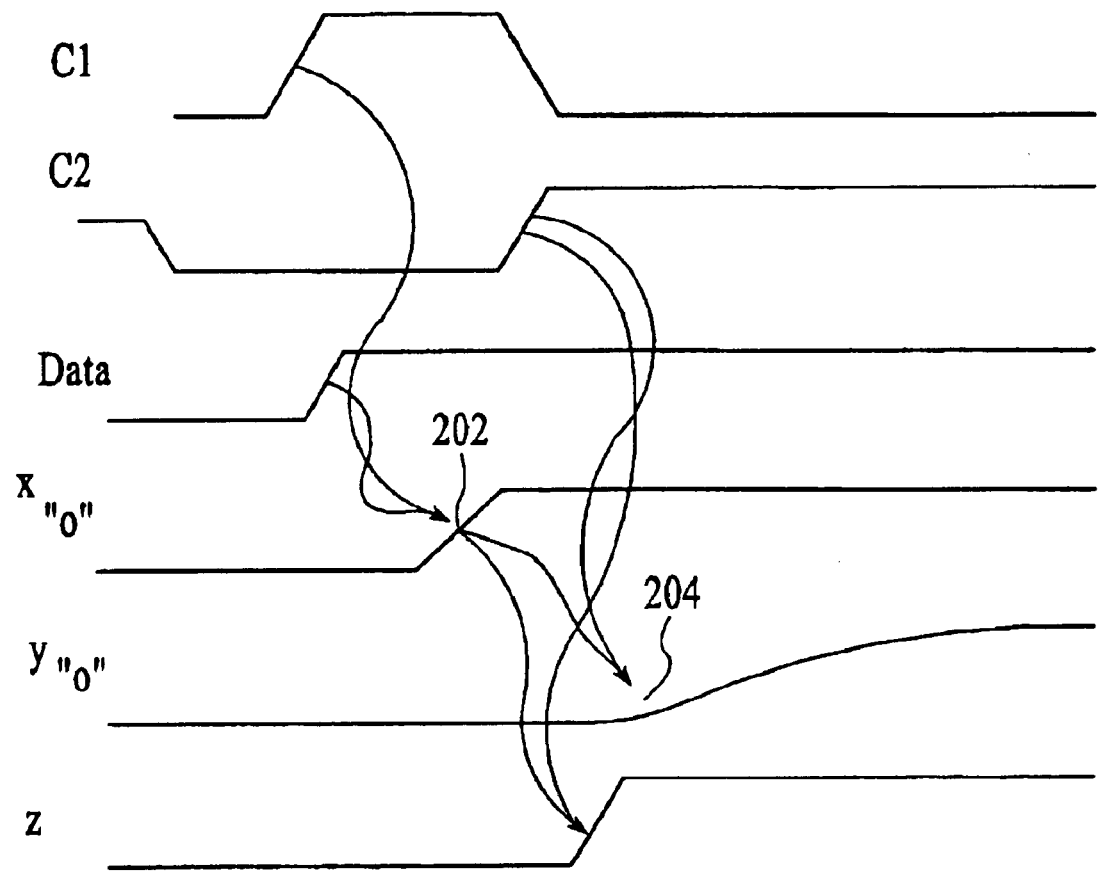
FIG. 2B is a timing diagram showing the operation of master-slave flip-flop of FIG. 2A.

FIG. 2B is a timing diagram showing the various signals of FF 100 of FIG. 2A. As is seen, clock C1 is shown as a first waveform, clock C2 is shown as a second waveform, and data is shown as a third waveform. As is also seen, the waveforms of the X, Y and Z nodes are shown. Referring now to both FIGS. 2A and 2B together, when the data is received by the master latch 110, it is passed to node X when the clock C1 goes high. The data is received by both the slave latch 112 and the multiplexor 114. Assuming the previous states of nodes Y and Z were a logical low, the state at both nodes Y and Z go high (shown in FIG. 2B AT 202 and 204, respectively) when the clock C2 goes high. As shown in the timing diagram, node Z changes at a significantly faster rate than does node Y. The signal at node Y changes at a slower rate than the signal at node Z because the slave latch 112 includes gates there within that consume less power since the slave latch utilizes all minimum devices. The slave latch 112 can be designed in this manner because it is not in the performance critical path.

Accordingly, in a system and method in accordance with the present invention, the multiplexor 114 outputs data from the master latch 110 when the clock C2 is active. When clock C2 is inactive (C2B), the multiplexor 114 outputs data from the slave latch 112. Therefore, in this embodiment, the multiplexor 114 receives data from the master latch 100 when the clock C2 clock is active. The multiplexor 114 outputs the data received from the master latch I/O 110 upon the clock C2 and provides the data from the slave latch 112 when the clock C2 is inactive (clock C28). In so doing, the slave latch 112 is not part of the critical performance path of the FF 100 and its size can be minimized to reduce power consumption there within.

A system and method in accordance with the present invention optimize power consumption in a flip-flop through the use of a multiplexor for the output function. As a result, the size of the slave latch can be minimized, which reduces the overall power consumption of the flip-flop.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A flip-flop comprising:

a first latch for receiving at least one bit;

a second latch coupled to the first latch for storing the at least one bit from the first latch, wherein the size of the second latch is smaller than the size of the first latch to reduce power consumption; and a multiplexor coupled to the first latch and to the second latch for outputting the at least one bit from the first latch when a first clock to the first latch is active and for outputting the at least one bit from the second latch when a second clock to the second latch is active.

2. The flip-flop of claim 1 wherein the multiplexor is a shunt multiplexor.

3. The flip-flop of claim 1 wherein a first clock causes the at least one bit to be provided from the first latch to the multiplexor and the second latch.

4. The flip-flop of claim 1 wherein the first latch is a master latch.

5. The flip-flop of claim 3 wherein the second latch is a slave latch.

6. A flip-flop comprising:

a master latch for receiving at least one bit;

a slave latch coupled to the master latch for storing the at least one bit from the master latch wherein the size of the slave latch is smaller than the size of the master latch to reduce power consumption; and a multiplexor coupled to the master latch and to the slave latch for outputting the at least one bit from the master latch when a first clock to the master latch is active and for outputting the at least one bit from the slave latch when a second clock to the slave latch is active.

7. The flip-flop of claim 6 wherein a first clock causes the at least one bit to be provided from the master latch to the multiplexor and the slave latch.

8. A method for optimizing power and performance in a flip-flop, wherein the flip-flop includes a first latch and a second latch coupled to the first latch, the method comprising the steps of:

(a) receiving at least one bit into the first latch, wherein the first latch outputs the at least one bit to the second latch and to a multiplexor when a first clock to the first latch is active;

(b) outputting the at least one bit received from the first latch from the multiplexor when the first clock is active; and (c) outputting the at least one bit received from the second latch from the multiplexor when a second clock to the second latch is active, wherein the size of the second latch is smaller than the size of the first latch to reduce power consumption.

9. A flip-flop comprising:

a master latch for receiving at least one bit;

a slave latch coupled to the master latch for storing the at least one bit, wherein the size of the slave latch is smaller than the size of the master latch to reduce power consumption; and a shunt multiplexor coupled to the master latch and to the slave latch for receiving the at least one bit, for outputting the at least one bit from the master latch when a first clock to the master latch is active, and for outputting the at least one bit from the slave latch when a second clock to the slave latch is active.

* * * * *